(12) United States Patent
Liaw

(10) Patent No.: US 8,009,463 B2
(45) Date of Patent: *Aug. 30, 2011

(54) CELL STRUCTURE FOR DUAL PORT SRAM

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 116 days.

This patent is subject to a terminal disclaimer.

(21) Appl. No.: 12/533,394

(22) Filed: Jul. 31, 2009

(65) Prior Publication Data

US 2011/0026308 A1 Feb. 3, 2011

(51) Int. Cl.
*G11C 11/00* (2006.01)
(52) U.S. Cl. .............. 365/154; 365/63; 365/230.05
(58) Field of Classification Search .......... 365/63, 365/154, 156, 230.05; 257/401, 503, 758, 257/903
See application file for complete search history.

(56) References Cited

U.S. PATENT DOCUMENTS

| | | | |
|---|---|---|---|
| 6,005,796 A | 12/1999 | Sywyk et al. | |
| 6,239,458 B1 | 5/2001 | Liaw et al. | |
| 6,380,024 B1 | 4/2002 | Liaw | |
| 6,417,032 B1 | 7/2002 | Liaw | |
| 6,535,453 B2 | 3/2003 | Nii et al. | |
| 6,569,723 B2 | 5/2003 | Liaw | |
| 6,649,456 B1 | 11/2003 | Liaw | |
| 6,693,820 B2 | 2/2004 | Nii et al. | |
| 6,738,305 B1 | 5/2004 | Liaw | |
| 6,812,574 B2 | 11/2004 | Tomita et al. | |
| 6,891,745 B2 | 5/2005 | Liaw | |
| 6,909,135 B2 | 6/2005 | Nii et al. | |
| 6,975,531 B2 | 12/2005 | Forbes | |
| 6,977,837 B2 | 12/2005 | Watanabe et al. | |
| 7,038,926 B2 * | 5/2006 | Jeong et al. | 365/63 |
| 7,236,396 B2 | 6/2007 | Houston et al. | |
| 7,525,868 B2 * | 4/2009 | Liaw | 365/230.05 |
| 7,606,061 B2 * | 10/2009 | Kengeri et al. | 365/154 |
| 7,738,282 B2 * | 6/2010 | Liaw | 365/154 |

(Continued)

OTHER PUBLICATIONS

Nii, K. et al., "A 90nm Dual-Port SRAM with 2.04um28T—Thin Cell Using Dynamically-Controlled Column Bias Scheme," ISSCC 2004/Session 27/SRAM/27.9, 2004 IEEE International Solid-State Circuits Conference, 10 pp. IEEE.

(Continued)

*Primary Examiner* — Gene N. Auduong
(74) *Attorney, Agent, or Firm* — Duane Morris LLP

(57) ABSTRACT

A multi-port SRAM cell includes cross-coupled inverters each including a pull-up transistor and at least a pair of pull down transistors. The SRAM cell includes first and second access ports coupled to first and second word line conductors, each access port including a first pass gate transistor coupled to the data storage node and a second pass gate transistor coupled to the data bar storage node, each pass gate transistor being coupled to a respective bit line conductor, wherein the pull down transistors of the first inverter are formed in a first active region, the pull down transistors of the second inverter are formed in a second active region, the pass gate transistors coupled to the data storage node are formed in a third active region and the pass gate transistors coupled to the data bar storage node are formed in a fourth active region.

19 Claims, 13 Drawing Sheets

U.S. PATENT DOCUMENTS

| | | |
|---|---|---|
| 2002/0127786 A1 | 9/2002 | Liaw |
| 2004/0076071 A1 | 4/2004 | Liaw |
| 2004/0090818 A1 | 5/2004 | Liaw |
| 2005/0253287 A1 | 11/2005 | Liaw |
| 2007/0025132 A1 | 2/2007 | Liaw |
| 2008/0197419 A1* | 8/2008 | Liaw .............................. 257/368 |
| 2009/0040858 A1 | 2/2009 | Kengeri et al. |

OTHER PUBLICATIONS

Koji Nii et al., "A 90nm Dual-Port SRAM with 2.04um2 8T—Thin Cell Using Dynamically-Controlled Column Bias Scheme", 2004 IEE International Solid State Circuits Conference, Feb. 15-19, 2004; 2004 IEEE.

* cited by examiner

CELL STRUCTURE FOR DUAL PORT SRAM

FIELD OF THE INVENTION

This invention relates generally to semiconductor devices, and more particularly to memory cells, and even more particularly to structures and layout designs of static random access memory cells.

BACKGROUND OF THE INVENTION

Static random access memories (SRAM) are commonly used in integrated circuits. Embedded SRAM is particularly popular in high speed communication, image processing and system on chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single port SRAM cell. Another type of SRAM cell is referred to as dual port SRAM cell, which includes four pass-gate transistors.

FIG. 1 illustrates an exemplary circuit diagram of a prior art eight-transistor dual port SRAM cell, which includes pull-up transistors PU-1 and PU-2 and pull-down transistors PD-1 and PD-2. Pass-gate transistors PG-1 and PG-3 form a first port (port-A) of the dual port SRAM cell. Pass-gate transistors PG-2 and PG-4 form a second port (port-B) of the dual port SRAM cell. The gates of pass-gate transistors PG-1 and PG-3 are controlled by word-line port-A WL, while the gates of pass-gate transistors PG-2 and PG-4 are controlled by word-line port-B WL. A latch formed of pull-up transistors PU-1 and PU-2 and pull-down transistors PD-1 and PD-2 stores a bit. The stored bit can be read through port-A using bit lines port-A BL and port-A BLB, or through port-B using bit lines port-B BL and port-B BLB. Conversely, a bit can be written into the SRAM cell through either port-A or port-B.

With two ports, the bit stored in the SRAM cell can be read from port-A and port-B simultaneously. This allows for parallel operations by different applications. Moreover, if a first SRAM cell and a second SRAM cell are in a same column or a same row, a read operation to the first SRAM cell can also be performed simultaneously with a write operation on the second SRAM cell.

Conventionally, to support parallel operations, in which two ports may be at the "on" state at the same time, the pull-down transistors PD-1 and PD-2 each need to sustain twice the drive current of each of the pass-gate transistors PG-1 through PG-4. Accordingly, in conventional designs, pull-down transistors PD-1 and PD-2 were designed twice as wide as pass-gate transistors PG-1 through PG-4. Typically, L- or T-shaped active regions are used to provide this uneven device sizing. FIG. 2 illustrates a conventional layout of transistors PG-1 and PD-1 in a common active region. The dotted region is an active region, and shaded regions are gate polysilicon lines. The active region is L-shaped, with a wide portion for forming pull-down transistor PD-1 being twice as wide or even greater than a narrow portion for forming passgate transistor PG-1. Due to optical effects, the intersection region between the wide portion and the narrow portion is rounded. If a misalignment occurs, and the gate poly of passgate transistor PG-1 is moved up, the actual gate width of pass-gate transistor PG-1 will be greater than desired. Accordingly, a mismatching occurs between pass-gate transistor PG-1 and pass-gate transistors PG-2 through PG-4, which in turn affects the SRAM cell performance.

An additional problem is the current crowding at the intersection region. In the intersection region, the currents are not evenly distributed. Therefore, some portions of the pull-down devices PD-1 and PD-2 may have greater current densities than other portions. Junction leakage is also a concern.

Accordingly, an improved SRAM cell that may incorporate dual ports thereof to take advantage of the benefits associated with the parallel operations is desired.

SUMMARY OF THE INVENTION

A multi-port SRAM cell is provided and includes first and second cross-coupled inverters having a data storage node and a data bar storage node, each inverter including a pull-up transistor and a pull down device, wherein each pull down device comprises at least a pair of pull down transistors having commonly connected source, drain and gate terminals. The SRAM cell includes first and second access ports coupled to first and second word line conductors, each access port including a first pass gate transistor coupled to the data storage node and a second pass gate transistor coupled to the data bar storage node, each pass gate transistor being coupled to a respective bit line conductor, wherein the pull down transistors of the first inverter are formed in a first active region, the pull down transistors of the second inverter are formed in a second active region, the pass gate transistors coupled to the data storage node are foamed in a third active region and the pass gate transistors coupled to the data bar storage node are formed in a fourth active region.

A multi-port SRAM cell is also providing including: first and second cross-coupled inverters having a data storage node and a data bar storage node, each inverter comprising a pull-up transistor and a pull down device, wherein each pull down device comprises at least a pair of pull down transistors having commonly connected source, drain and gate terminals; first and second access ports coupled to first and second word line conductors, each access port including a first pass gate transistor coupled to the data storage node and a second pass gate transistor coupled to the data bar storage node, each pass gate transistor being coupled to a respective bit line conductor; a first power supply conductor Vdd and a pair of second power supply conductors Vss; a first metallization layer including conductors for making local intra-cell connections between the pass gate transistors and the pull down devices; a second metallization layer formed over the first metallization layer containing the bit line conductors and power supply conductors; and a third metallization layer formed over the second metallization layer containing the word line conductors.

A multi-port SRAM cell is also provided and includes first and second cross-coupled inverters having a data storage node and a data bar storage node, each inverter comprising a pull-up transistor and a pull down device; first and second access ports coupled to first and second word line conductors, each access port including a first pass gate transistor coupled to the data storage node and a second pass gate transistor coupled to the data bar storage node, each pass gate transistor being coupled to a respective bit line conductors; and a first power supply conductor Vdd and a pair of second power supply conductors Vss. The bit line conductors and power supply conductors are formed in a common metallization layer, and the bit line and power supply conductors are disposed in parallel, with the first power supply conductor Vdd centered among the conductors and the pair of second power supply conductors Vss disposed adjacent the first power supply conductor on opposite sides of the first power supply conductor.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
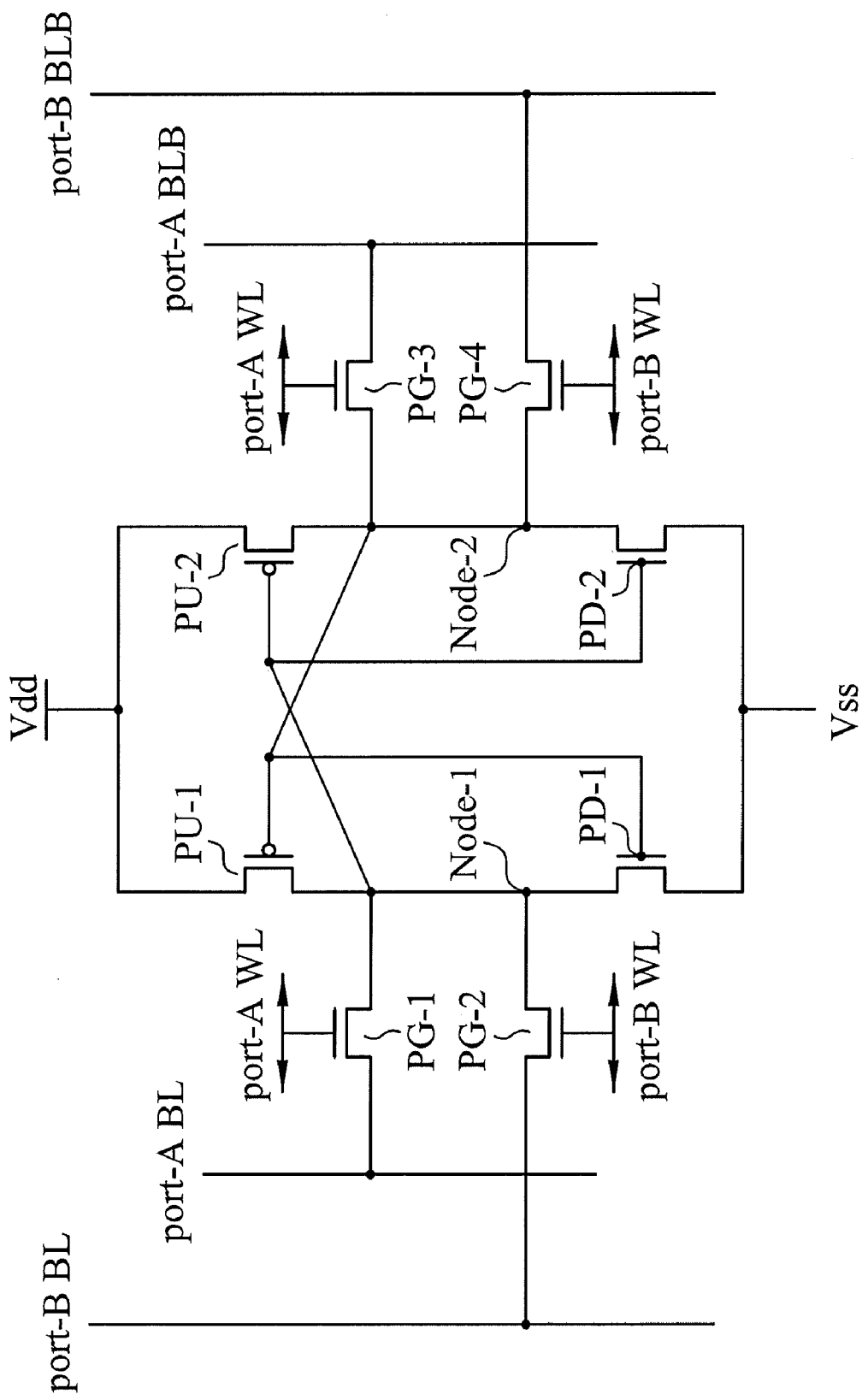
FIG. 1 illustrates a circuit diagram of a conventional 8-transistor dual port static random access memory (SRAM) cell.
Figure 2:
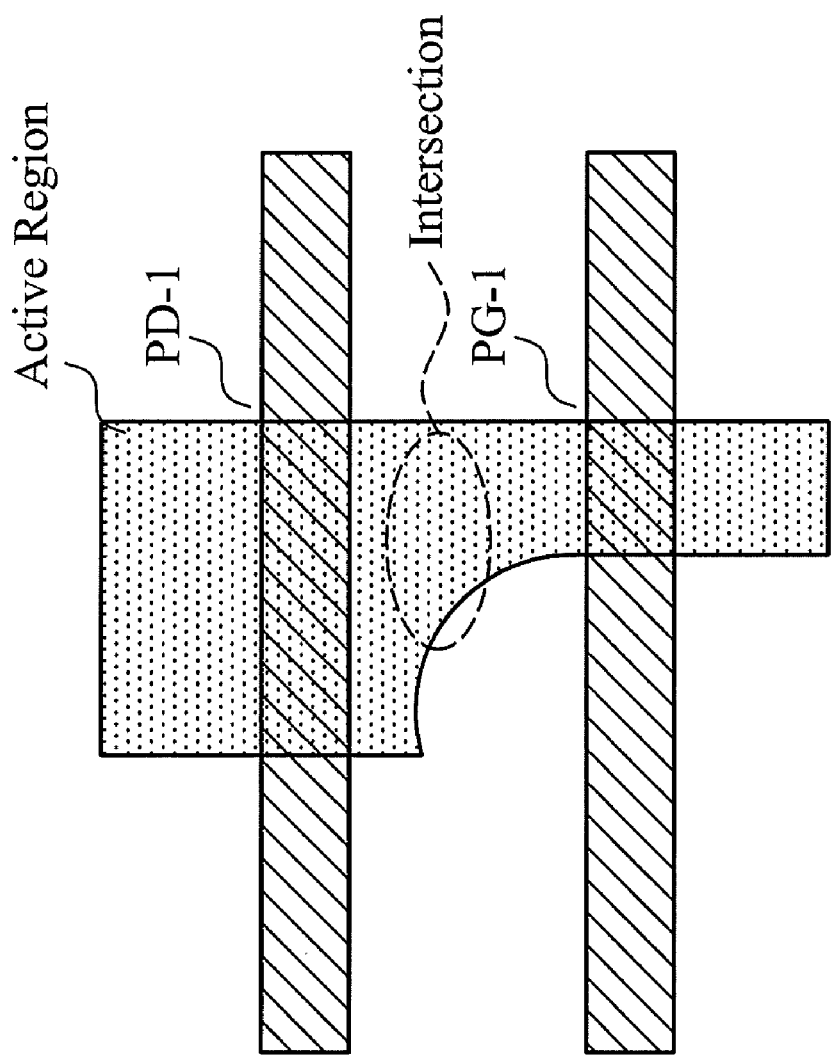
FIG. 2 illustrates a portion of the layout showing transistors PG-1 and PD-1 in FIG. 1.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Described herein are improved designs for a dual port SRAM cell layout. In embodiments, the design provides a low resistance current path, which limits cell current degradation and asymmetry issues for thin film (e.g., Y-pitch (WL length)-to-X-pitch (BL length) ratio greater than 3.5) dual port cells. In embodiments, the SRAM cell utilizes an improved pull-down transistor design that alleviates current crowding effects associated with other designs, as well as data node leakage issues associated therewith. The proposed layout is also readily adaptable to anticipated future technologies.

Figure 4A:
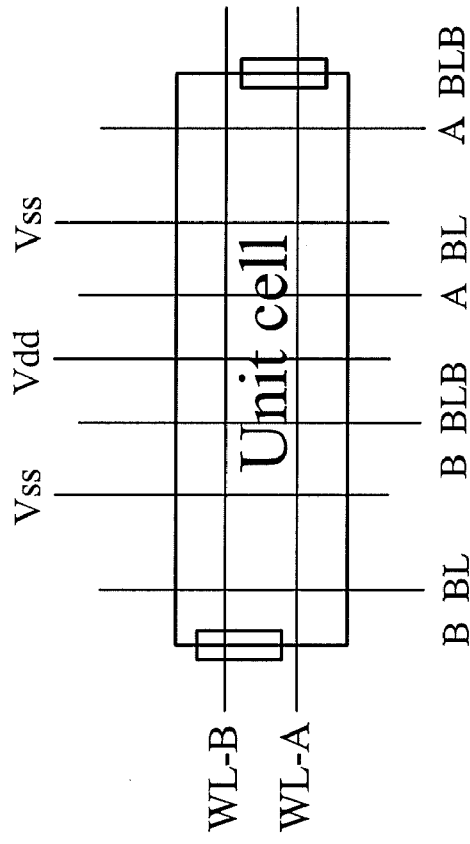
FIG. 4A is an illustration of the metal routing layout for a prior art dual-port SRAM cell and FIGS. 4B and 4C illustrate the metal routing layout for a dual-port SRAM cell according to alternative embodiments of the present invention.
Figure 4C:
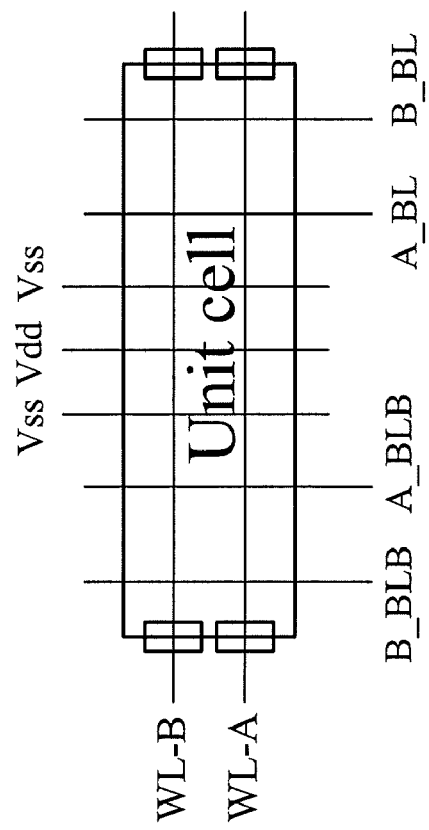
Figure 4B:
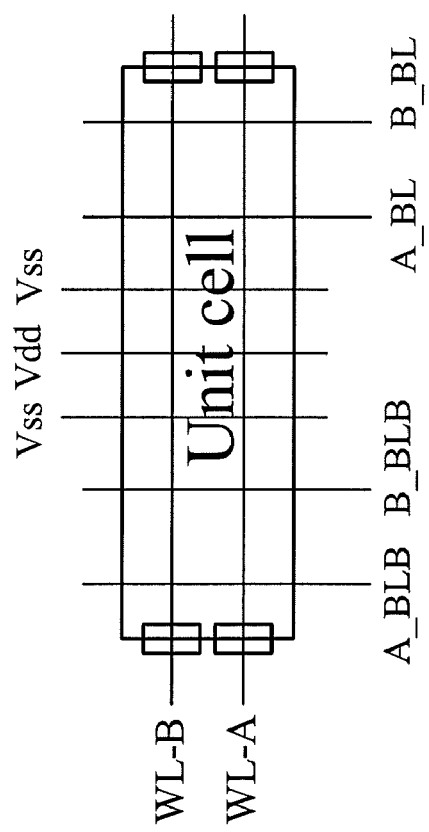
Figure 5A:
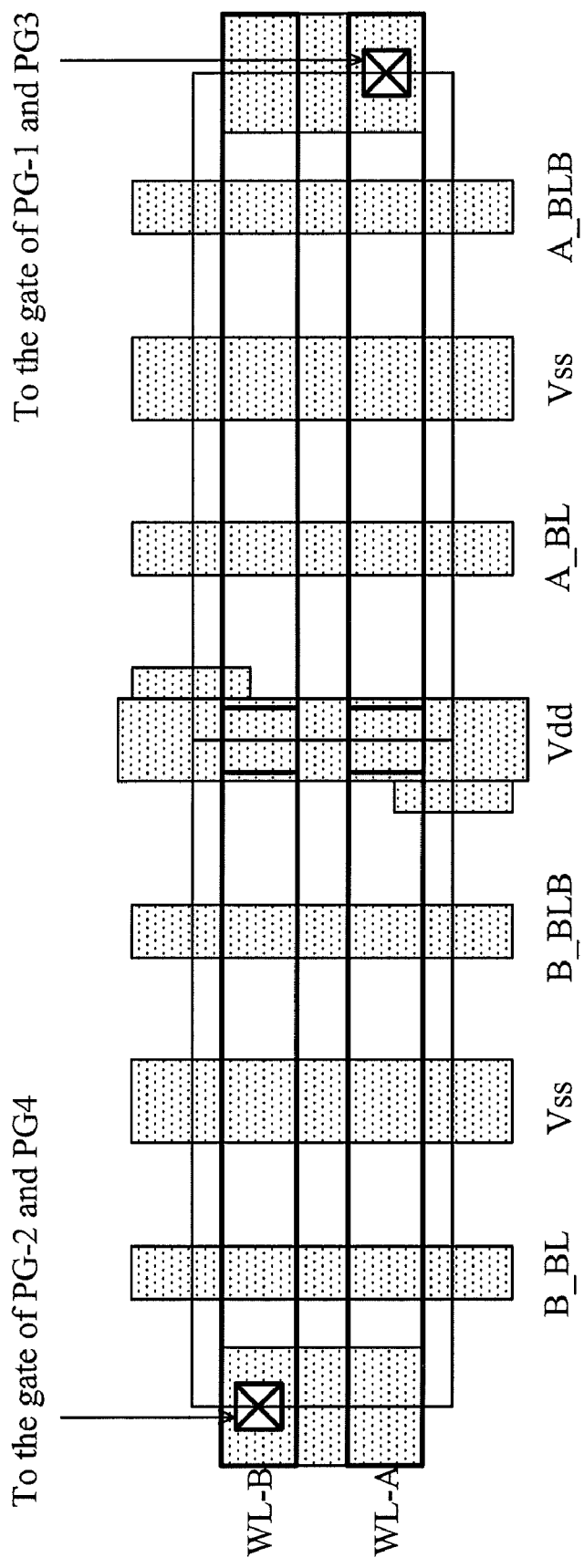
FIGS. 5A-5C illustrate more detailed views of the metal routing layouts of FIGS. 4A-4C.
Figure 5B:
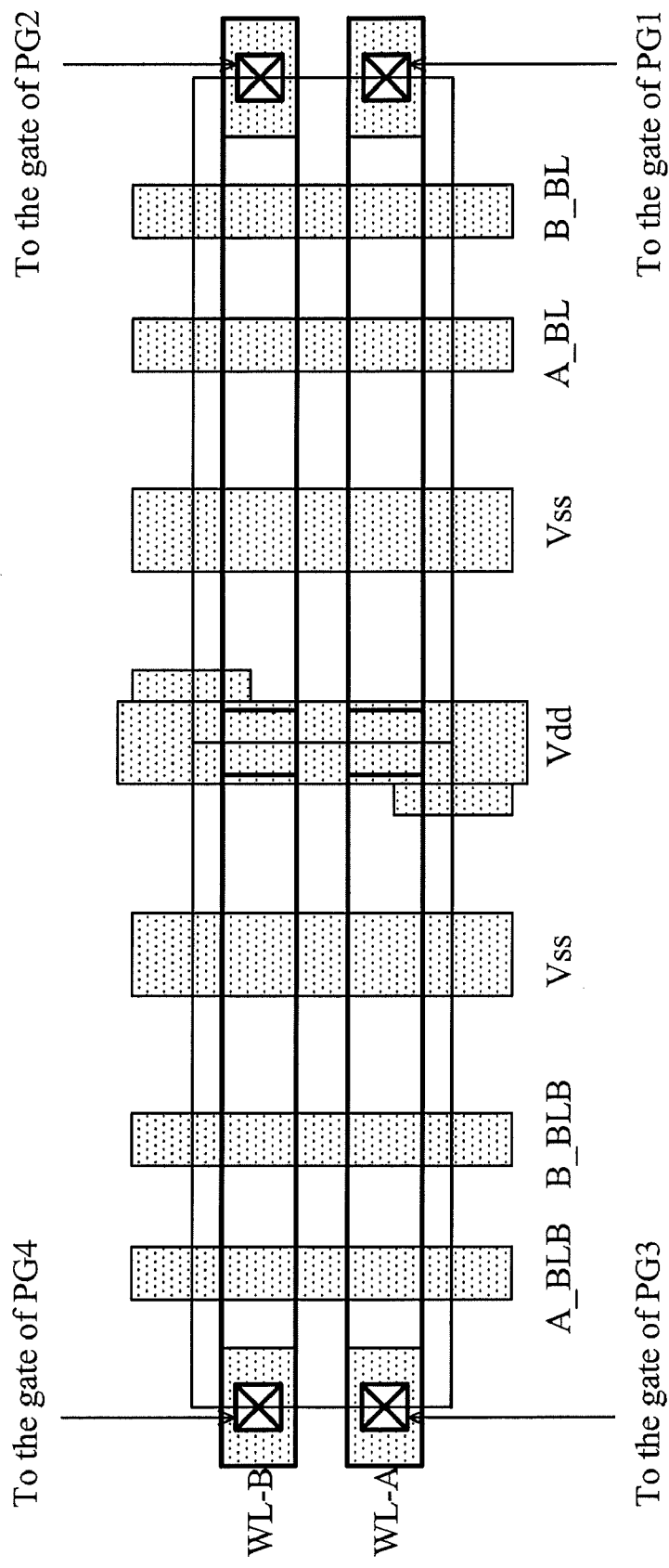
Figure 5C:
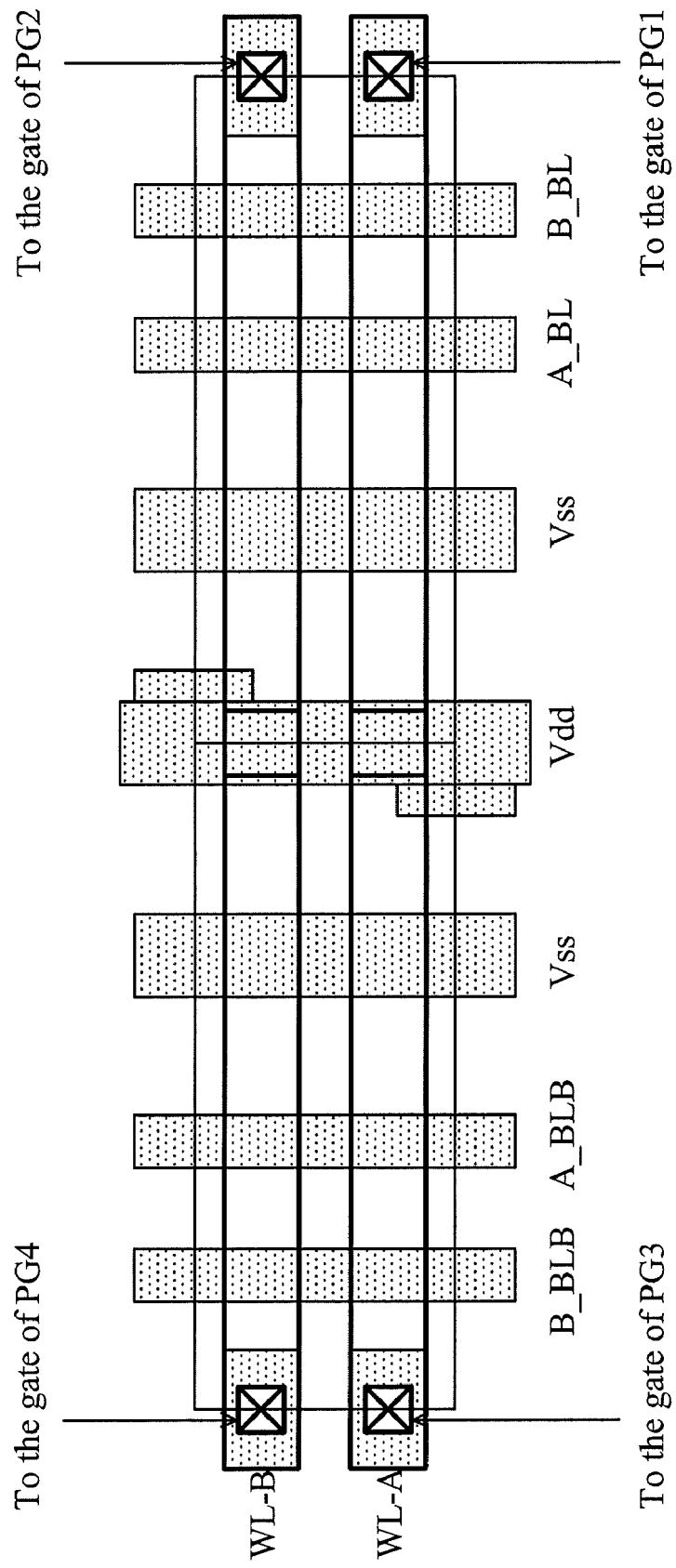

FIG. 4A is an illustration of the metal routing layout for a prior art dual-port SRAM cell. As can be seen from FIG. 4A, the Vss (ground) and Vdd conductors are disposed in between adjacent bit lines, for Ports A and B. FIGS. 4B and 4C illustrate an improved metal routing layout for a dual-port SRAM cell of the eight transistor or ten transistor variety disclosed herein. As can be seen in these figures, the two Vss conductors and the Vdd conductor are centered, with the two Vss conductors immediately adjacent the sides of the central Vdd conductor. The bit line data bar conductors for Ports A and B are disposed on one side of the power supply conductors and the bit line data conductors for Ports A and B are disposed on the opposite side of the power supply conductors. These conductors (i.e., the bit line conductors and power supply conductors) are preferably disposed in the same metallization layer, specifically the second metallization layer (M2) in embodiments, such as those discussed below where the first metallization layer (M1) is utilized for providing local intra-cell connection. This particular M2 layout effectively balances the bit line coupling capacitance between A-BL to A-BLB or B-BL to B-BLB. The word line (WL) conductors for ports A and B are disposed orthogonal to the bit line and power supply conductors and in the third metallization layer (M3) formed over the second metallization layer. bit line More detailed metal views of these layouts are shown in FIGS. 5A to 5C.

Figure 3:
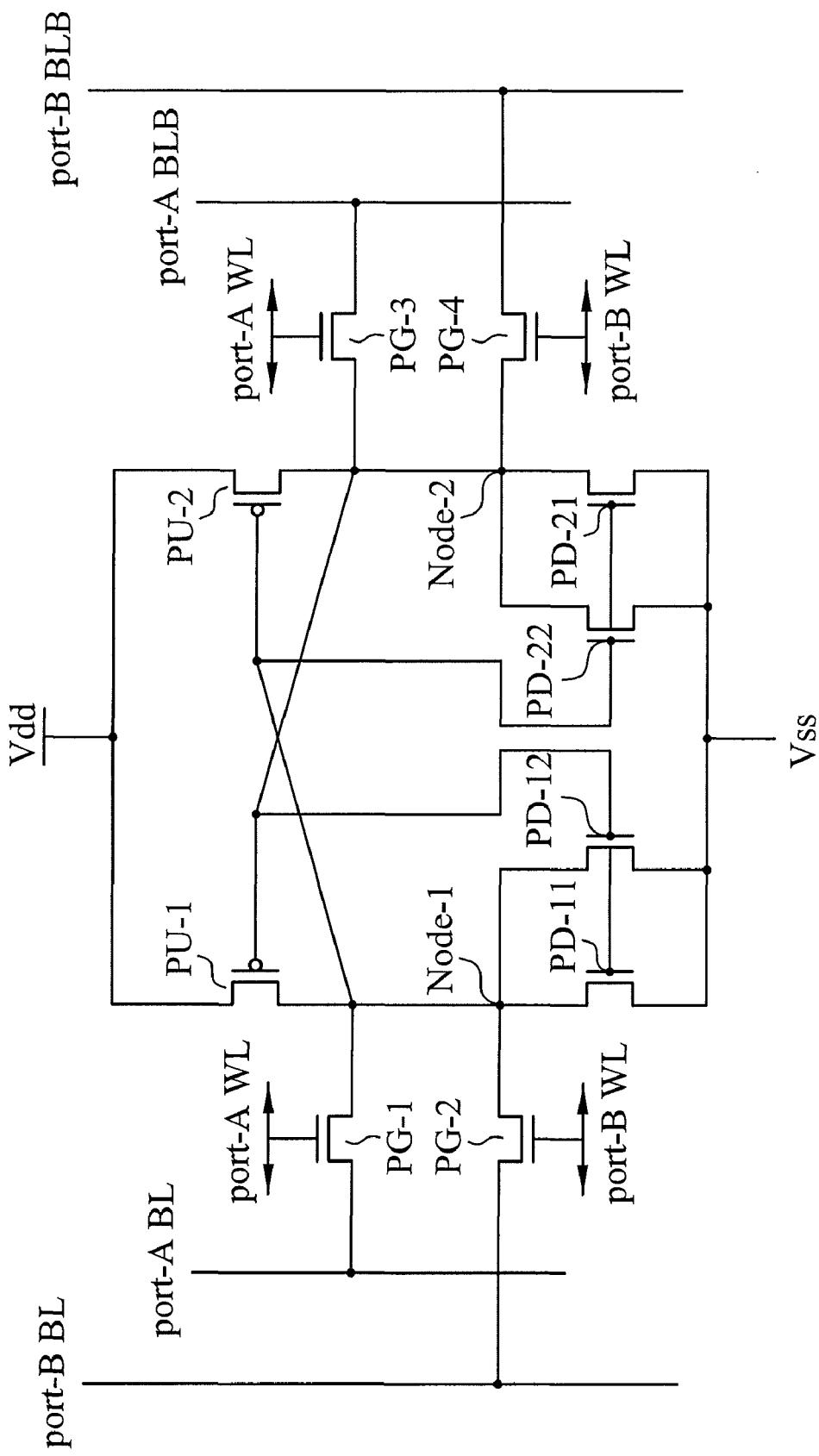
FIG. 3 illustrates a circuit diagram of a dual port SRAM cell embodiment.

In exemplary embodiments, the length ratio of the WL to BL conductors (defined by unit cell) is 3.5 or larger. The major design concern with thin style SRAM cells is speed. Such cells have short bit line length in the unit cell. These bit lines connect will connect to sense amplifiers for signal detection (i.e., to detect a logical "0" or "1") during a read cycle. Having short bit lines provides lower metal coupling capacitance, and therefore higher speeds (or lower RC delay). Another benefit is cell size reduction, which saves area on the chip. My copending, commonly assigned U.S. patent application Ser. No. 11/787,677, filed Apr. 17, 2007, entitled "Cell Structure for Dual Port SRAM," the entirety of which is hereby incorporated by reference herein, discloses a novel static random access memory (SRAM) cell structure and the corresponding layouts for the structure. FIG. 3 is a circuit diagram of this dual port SRAM cell structure. The SRAM cell includes pull-up transistors PU-1 and PU-2 and pull-down transistors PD-11, PD-12, PD-21 and PD-22. Pass-gate transistors PG-1 and PG-3 form a first port (port-A) of the dual port SRAM cell. Pass-gate transistors PG-2 and PG-4 form a second port (port-B) of the dual port SRAM cell. The gates of pass-gate transistors PG-1 and PG-3 are controlled by a word-line denoted as port-A WL, while the gates of pass-gate transistors PG-2 and PG-4 are controlled by a word-line denoted as port-B WL.

Pull-down transistors PD-11 and PD-12 have their sources interconnected, their drains interconnected, and their gates interconnected. Pull-down transistors PD-21 and PD-22 have their sources interconnected, their drains interconnected, and their gates interconnected. Accordingly, pull-down transistors PD-11 and PD-12 act as a single pull-down transistor, and pull-down transistors PD-21 and PD-22 act as a single pull-down transistor.

Figure 6:
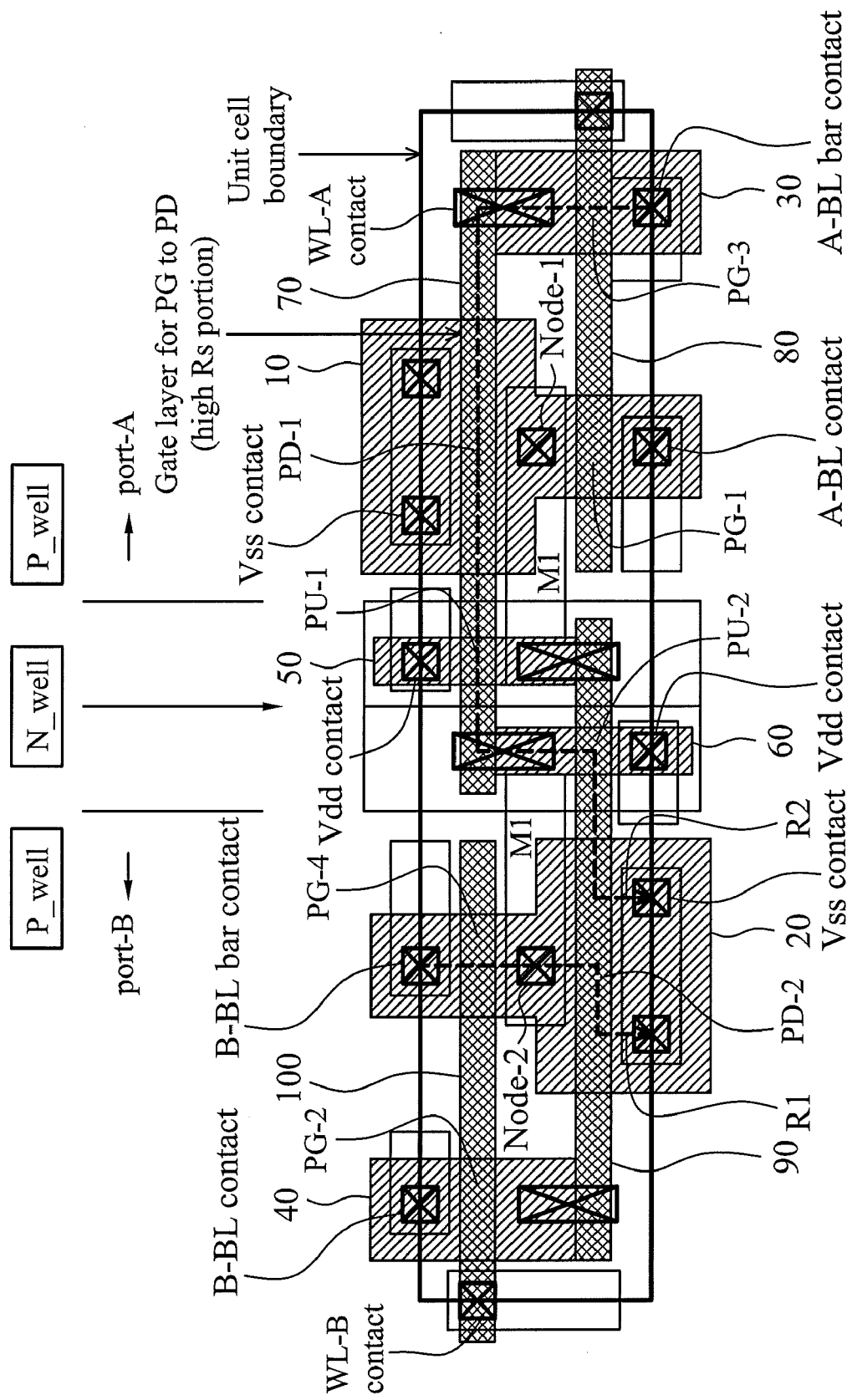
FIG. 6 illustrates the layout of the prior art 8-transistor SRAM cell shown in FIG. 1.

FIG. 6 illustrates an example layout of the prior art 8-transistor SRAM cell shown in FIG. 1, wherein like devices and nodes in FIG. 1 are shown with like reference notations. FIG. 6 illustrates the active regions, N- and P-wells, poly-1, contact and M1 features of the cell. As can be seen from FIG. 6, PD-1 and PG-1 are formed in a T-shaped active region 10. Likewise, PD-2 and PG-4 are formed in a T-shaped active region 20. PG-3 and PG-2 are formed in their own, separate active regions 30 and 40, respectively. PU-1 and PU-2 are formed in active regions 50 and 60, respectively. As will be understood by those familiar with this art, the active areas are separated from each other by a field isolation, such as a shallow trench isolation (STI) region.

A common gate poly 70 is shared by transistors PD-1 and PU-1, and a common gate poly 80 is shared by transistors PG-1 and PG-3. Likewise, a common gate poly 90 is shared by transistors PD-2 and PU-2, and a common gate poly 100 is shared by transistors PG-2 and PG-4. Throughout the description, the term "gate poly" is used to refer to the conductive lines used for forming gates of transistors, even if the conductive lines may be formed of conductive materials other than polysilicon, such as metals, metal silicides, metal nitrides, and combinations thereof. Of particular note, the electrical connection between the gate of PD-1 and the source of PG-3 is made through gate poly 70, which has a relatively high sheet resistance Rs. Similarly, the connection between the gate of PD-2 and the source of PG-2 is made through gate poly 90. This high resistance connection degrades the cell current, which is a serious concern for low operating voltage devices.

Figure 6A:
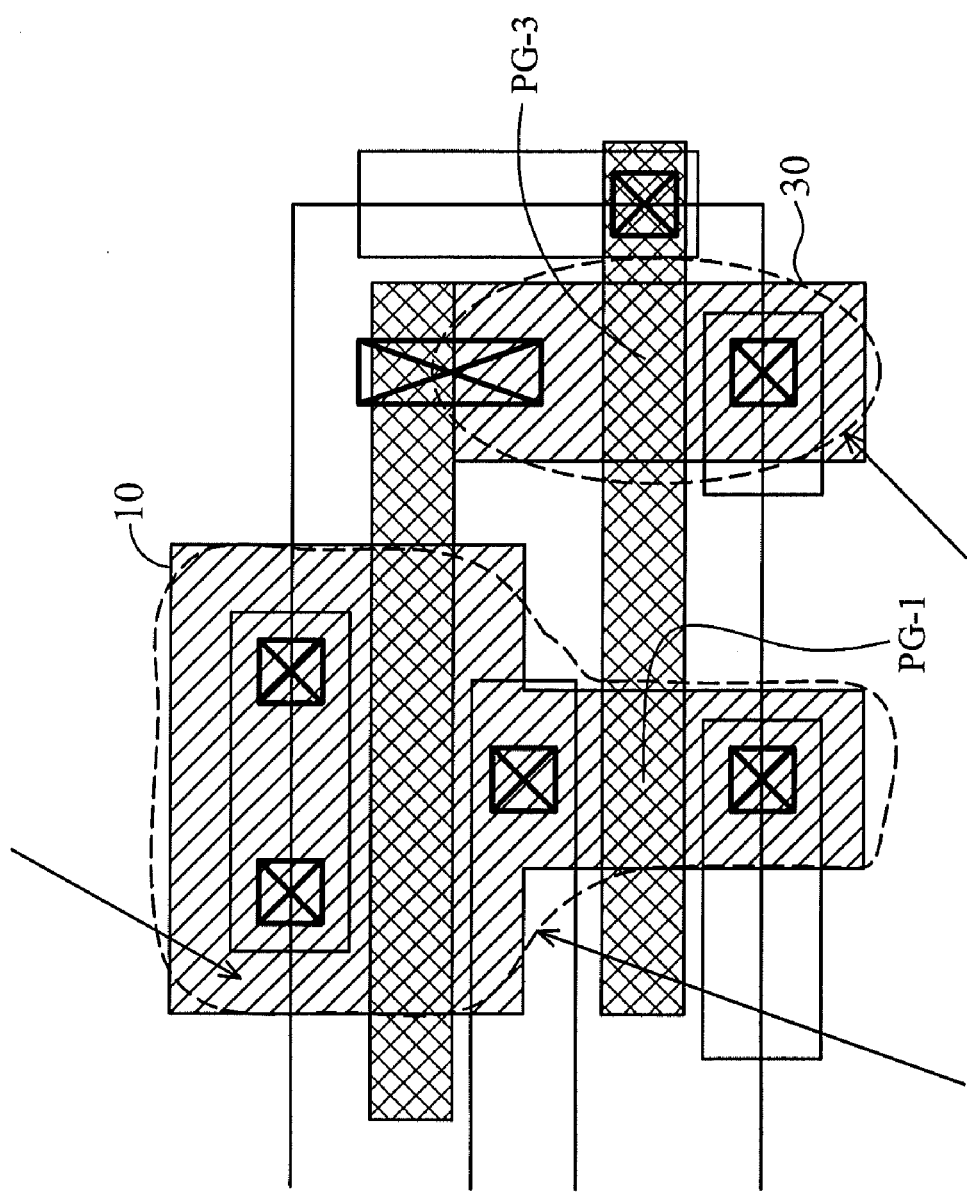
FIG. 6A is a partial view of the layout of FIG. 6 illustrating corner rounding due to lithography proximity effects.

FIG. 6A is a partial view of the layout of FIG. 6 illustrating corner rounding (identified by the reference arrows) in the active regions due to lithography proximity effects. This corner rounding can lead to current crowding and device mismatch issues discussed above.

Figure 7:
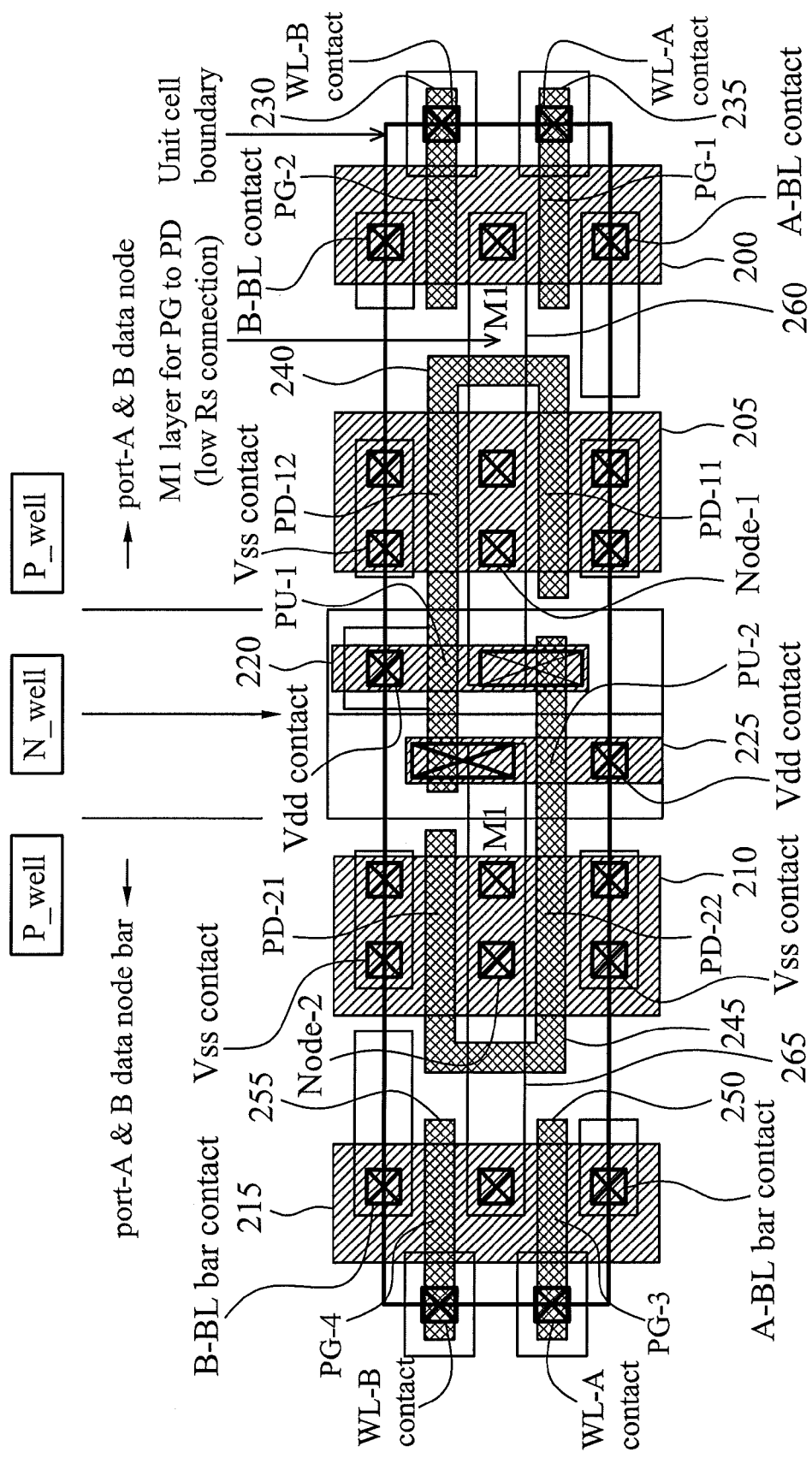
FIG. 7 illustrates the layout of the SRAM cell shown in FIG. 3 according to one exemplary embodiment of the present invention.

FIG. 7 illustrates an improved layout for the 10-transistor SRAM cell shown in FIG. 3, wherein like devices and nodes in FIG. 3 are shown with like reference notations in FIG. 7. FIG. 7 illustrates the active regions, N- and P-wells, poly-1, contact and M1 features of the cell. As can be seen from FIG. 7, PG-1 and PG-2 are formed in a first active region 200. Likewise, PG-3 and PG-4 are formed in a second active region 215. Folded transistors PD-12 and PD-11 are formed in a third active region 205, and PD-21 and PD-22 are formed in a fourth active region 210. PU-1 and PU-2 are formed in fifth and sixth active regions 220, 225, respectively. The active areas are separated from each other by a field isolation, such as a shallow trench isolation (STI) region.

As can be seen in FIG. 7, active regions 200, 205, 210 and 215 for the PD and PG devices have simple, rectangular patterns. These active regions provide for improved device matching, as the uniform widths can be accurately defined, as well as very lithography friendly environment. Current crowding and junction leakage are also not concerns with this layout. As technology continuous to shrink, this layout approach makes the design particularly suited for high-K dielectric/metal-gate structures and FinFET MOSFET structures. Further, given the same cell footprint, this cell design layout can provide at least a 30% cell current (I-cell) increase compared with the older design described above, before even taking into account the cell current penalties associated with high resistance poly lines 70, 90 in the cell current path of the prior design (discussed below). For example, given the same cell size (fixed X and Y pitches), the new cell layout of FIG. 7 can have PG and PD channel widths that are at least 1.3 times the size of those of the conventional cell. This provides at least a 30% increase in cell current.

Gate polys 230, 235 correspond to PG-2 and PG-1, respectively, and gate polys 250, 255 correspond to PG-3 and PG-4, respectively. A common gate poly 240 corresponds to PU-1, PD-12 and PD-11. As can be seen in the drawings, this common gate poly has a u-shaped portion that overlaps active region 205 as part of PD-12 and PD-11. Similarly, common gate poly 245 corresponds to PU-2, PD-21 and PD-22 and includes a respective u-shaped portion overlapping active region 210.

Portions of the first metallization layer are also illustrated in FIG. 7. In addition to coupling the drain terminals of the PD transistors to the drain terminals of the p-type PU transistors, the Metal-I (MI) layer provides low resistance connections between the PG and PD transistors. More specifically, the Metal-I connection 260 provides a low resistance connection between the common source terminals of PG-1 and PG-2 and the common drain terminals of PD-11 and PD-12. Likewise, the Metal-I connection 265 provides a low resistance connection between the common source terminals of PG-3 and PG-4 and the common drain terminals of PD-21 and PD-22.

The drain terminals of PD-11 and PD-12 are electrically coupled together in the active region, preferably by a low resistance silicide layer. The drain terminals of PD-21 and PD-22 are coupled together in the same manner. The source terminals of PG-1 and PG-2 are also coupled together in the active region, such as by a silicide layer, as are the source terminals of PG-3 and PG-4. Separate contacts to WL-A are made by the gate terminals of PG-1 and PG-3, as are separate contacts to WL-B by PG-2 and PG-4.

In addition to increases in cell current discussed above due to larger channel widths for PD and PG devices, the new cell layout of FIG. 7 does not incur cell current penalties associated with high resistance poly lines 70, 90 in the cell current path of the prior design (See FIG. 6). Increased cell current benefits the beta ratio and the signal-to-noise (SNR) ratio of the device, particularly for low operating voltage requirements. In conventional cells, there are two difference cell current (Icell) paths, one through BL and one through BLB. These paths have difference connection resistances between the pass gate device and the pull down device. Examples of these resistance paths are shown in dashed lines on the layout diagram of FIG. 6. The short, low resistance current path between B-BL bar and Vss through PG-4 and PD-2 is represented as resistance $R_1$, and the longer, high resistance current path between A-BL bar and Vss through PG-3 and PD-2 is represented as resistance $R_2$. The beta ratio is defined for cell current (Icell) impact vs. connection path resistance. The table below illustrates the results of a simulation for a Vdd level of 0.85 volts. Resistance refers to the additional resistance added between the PG and PD devices in a given cell current path. The chart illustrates the effect of this additional resistance (between PG and PD) on cell current and Beta ratio. An additional resistance of 2000Ω, for example, corresponds to the resistance one would expect to see through a high resistance current path, such as the one ($R_2$) traced from PG-3 to PD-2 in the layout of FIG. 6.

| Resistance (in Ω) | Icell (in μA) | Beta Ratio |
|---|---|---|
| 0 | 31.3 | 0.0% |
| 200 | 30.6 | 2.1% |
| 400 | 29.9 | 4.2% |
| 600 | 29.3 | 6.2% |
| 2000 | 25.7 | 17.9% |

For the device layout illustrated in FIG. 7, the connection path resistance for both BL and BLB current paths is less than 200Ω, which provides little cell current degradation and excellent beta ratio.

Figure 8:
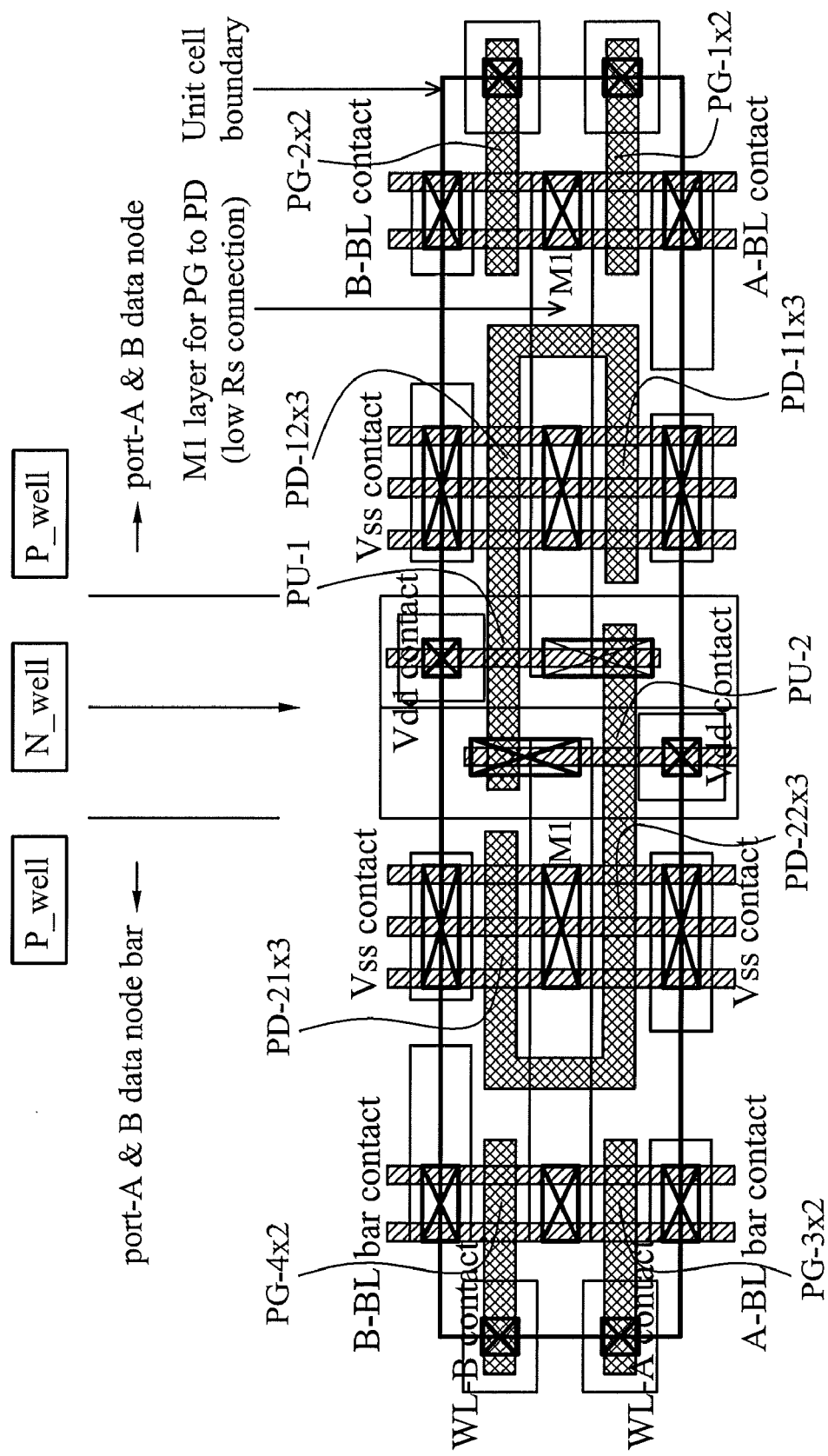
FIG. 8 illustrate an alternative embodiment of the layout of FIG. 7.

FIG. 8 illustrates an alternative layout of the 10-transistor SRAM cell shown in FIG. 3. The layout of FIG. 8 is identical to that of FIG. 7 except that the PG, PD and PU gates are illustrated as having FinFET device structures. The PD and PG devices are multiple drain/source FinFETs. The drain node connection can be by way of contact or by epitaxial-silicon/silicide layer.

Figure 9:
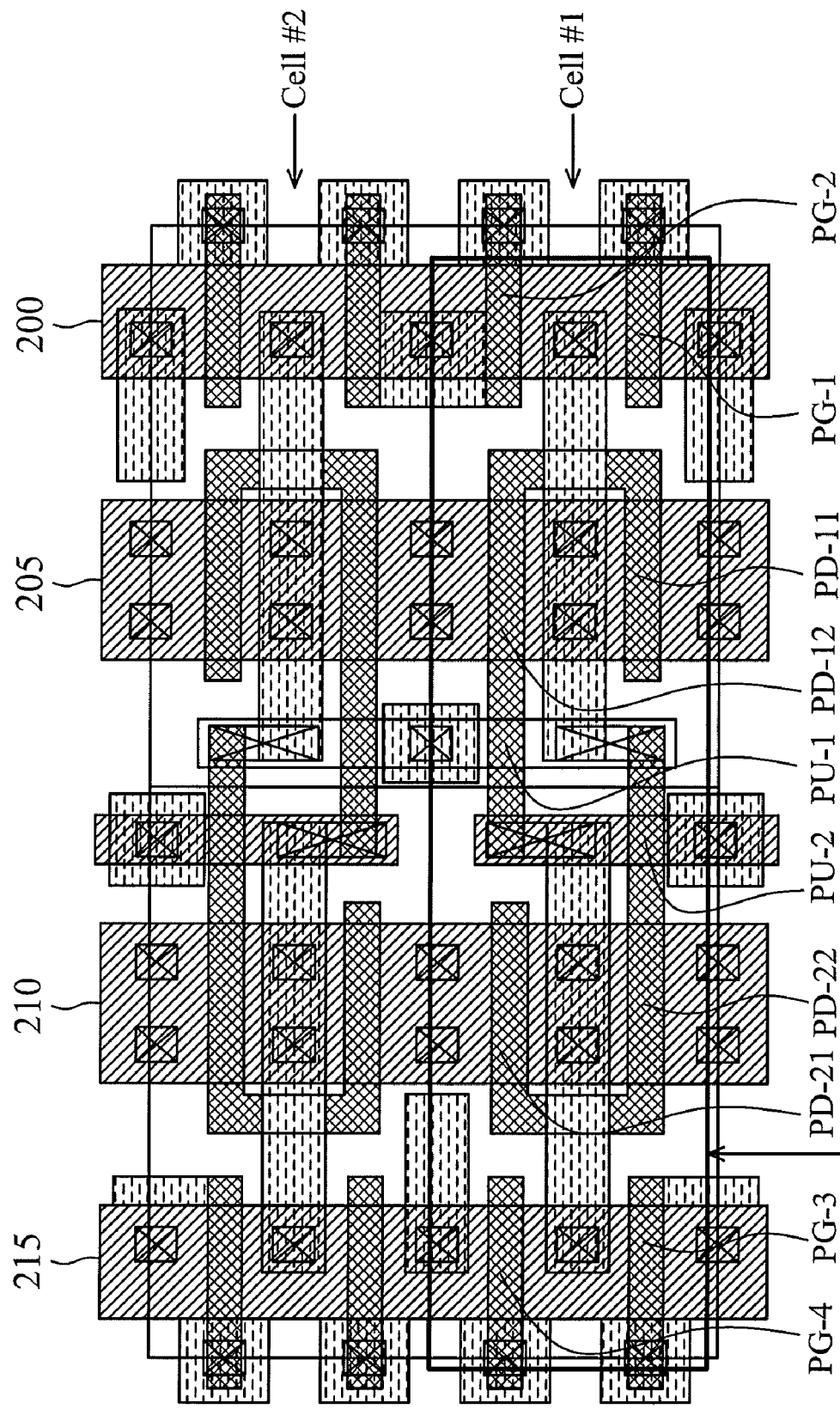
FIG. 9 illustrates the layout of FIG. 7 as part of a cell array.

FIG. 9 illustrates the SRAM cell layout of FIG. 7 in a cell array, specifically a one column, two row array. Although FIG. 9 only illustrates two cells (1C×2R), as will be understood by those familiar with the art of SRAM array design, a typical SRAM cell array would be a matrix of 4×4 cells to 512×512 cells. FIG. 9 is offered simply to illustrate that the active regions 200, 210, 205, 215 in which the PG and PD transistors are formed can extend continuously (up and down from the illustrated view) across multiple rows of cells, e.g., at least 4 rows of cells.

Figure 10:
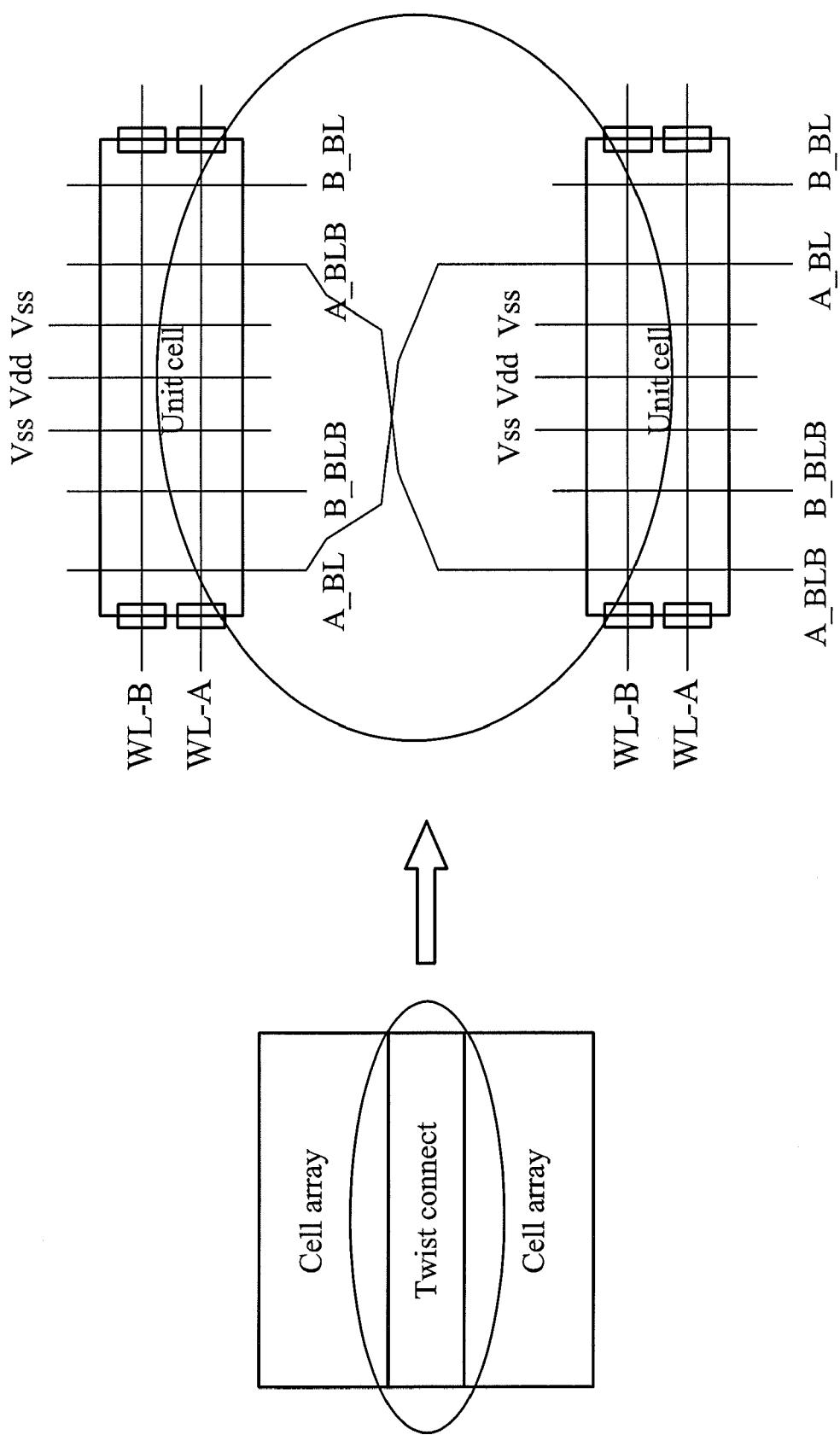
FIG. 10 illustrates SRAM cells of an array coupled by a twisted bit line conductor coupling.

FIG. 10 illustrates that the SRAM cells of an array can be coupled together in a cell array by a twisted bit line conductor coupling. Although this twisted connection is shown only for the Port A BL and BLB connections, it should be understood that these connections can also be made for Port B connections. This twisted coupling can help compensate for different environments across the array (by the lines in effect switching places through the array so that they experience more similar environments overall) and/or provide ease of manufacturing, space savings, or other performance benefits.

As described above, the use of straight-edge and continue OD layouts for both PG and PD transistors provides better device tracking (or matching) between PG devices and PD devices over a wider range of operating voltages (from highest to lowest Vdd levels). Forming the PG devices in the same active region can also minimize asymmetries between pass gate devices (PG1, PG2, PG3 and PG4). This OD layout shape also solves problems associated with irregularly shaped active regions, such as PD current crowding issues and lithography proximity effects. Moreover, the new PD/PG device layout addresses L-shape or T-shape induced N-node junction leakage issues, and therefore provides better Vdd_min performance. The design provides improved beta ratio and SNM at low operating voltages (e.g., 0.85 V and below). In the same footprint, the new cell provides significant improvements in cell current compared with previous designs. This aspect of the design also benefits the beta ratio and SNM for low operating voltages.

In the embodiment discussed in the preceding paragraphs, two pull-down (PD) transistors are interconnected to function as a single pull-down transistor. If needed, three or more (e.g., 3 to 64) pull-down transistors can be connected to function as a single pull-down transistor, resulting in more evenly distributed currents, particularly for MOS devices with high drive currents. One skilled in the art will realize the respective layouts. Depending on the number of pull-down transistors, these pull-down transistors could each be formed in the same active region or distributed across multiple active regions (e.g., 2 to 4 pull-down transistors per active region).

Further, although embodiments of a dual-port SRAM cell are illustrated, it should be understood that the invention is not so limited and the concepts illustrated herein could be modified to accommodate higher order multi-port SRAM cell, e.g., from 3 to 64 ports. The number of word lines and cell transistors could be adjusted to accommodate the drive current needs of such a device.

Further, as needed, each cell could have multiple pull-up devices (e.g., 2 to 32) formed on multiple active regions, i.e., at least one pull-up device per active region). This design is particularly applicable to cells using FinFET devices. In planer MOSFETs, the width size of the device can be increases to increase the transistor current. But for FinFET devices, transistor current is determined by the number of fins. Multiple devices (for a total wider channel width) can be used for high speed designs.

In embodiments, the substrate material of the SRAM device can be bulk-Si, SiGe, SiC, Ge, SOI-Si, SOI-SiGe, or combinations thereof. In exemplary embodiments, the SRAM device is incorporated into a system-on-chip (SOC) design. The gate structure of the SRAM devices can be a polysilicon gate/SiON dielectric structure, metal gate/high-K dielectric structure, or some combination thereof. The transistor structures can be that of planar MOSFET, FinFET MOSFET or combination thereof.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A multi-port static random access memory (SRAM) cell comprising:
   first and second cross-coupled inverters having a data storage node and a data bar storage node, each inverter comprising a pull-up transistor and a pull down device, wherein each pull down device comprises at least a pair of pull down transistors having commonly connected source, drain and gate terminals; and
   first and second access ports coupled to first and second word line conductors, each access port including a first pass gate transistor coupled to the data storage node and a second pass gate transistor coupled to the data bar storage node, each pass gate transistor being coupled to a respective bit line conductor,
   wherein the pull down transistors of the first inverter are formed in a first active region, the pull down transistors of the second inverter are formed in a second active region, the pass gate transistors coupled to the data storage node are formed in a third active region and the pass gate transistors coupled to the data bar storage node are formed in a fourth active region.

2. The multi-port SRAM cell of claim 1, wherein the pull-up transistor of the first inverter is located on a fifth active region and the pull-up transistor of the second inverter is located on a sixth active region.

3. The multi-port SRAM cell of claim 1, wherein the active regions are isolated from one another by a field isolation structure.

4. The multi-port SRAM cell of claim 1, wherein the pull down transistors and pass gate transistors are FinFET devices.

5. The multi-port SRAM cell of claim 4, wherein the pull-up transistors are FinFET devices.

6. The multi-port SRAM cell of claim 1, wherein the drain terminals of the pull down transistors of the first inverter are coupled together in the first active region by a first silicide layer, the drain terminals of the pull down transistors of the second inverter are coupled together in the second active region by a second silicide layer, source terminals of the pass gate transistors coupled to the data storage node are coupled together in the third active region by a third silicide layer, and source terminals of the pass gate transistors coupled to the data bar storage node are coupled together in the fourth active region by a fourth silicide layer.

7. The multi-port SRAM cell of claim 1, further comprising a first power supply conductor Vdd and a pair of second power supply conductors Vss, wherein the bit line conductors and power supply conductors are formed in a first common metallization layer and the word line conductors are formed in a second common metallization layer, the second common metallization layer being formed over the first common metallization layer.

8. The multi-port SRAM cell of claim 7, further comprising a third common metallization layer disposed under the first common metallization layer, the first common metallization layer including conductors making local intra-cell connections between the pass gate transistors and the pull down devices.

9. The multi-port SRAM cell of claim 1, further comprising a first power supply conductor Vdd and a pair of second power supply conductors Vss, wherein the power supply conductors and bit-line conductors are disposed in parallel in a common metallization layer, with the first power supply conductor Vdd centered among the conductors and the pair of second power supply conductors Vss disposed adjacent the first power supply conductor Vdd on opposite sides of the first power supply conductor Vdd.

10. The multi-port SRAM cell of claim 1, wherein the active regions extend across multiple SRAM cells in a cell array.

11. The multi-port SRAM cell of claim 1, wherein a length ratio of the word line conductors to the bit line conductors is at least 3.5.

12. The multi-port SRAM cell of claim 1, wherein:
the gate terminals of the pull down transistors of the first inverter and a gate terminal of the pull up transistor of the first inverter are coupled together by a first common gate line, and
the gate terminals of the pull down transistors of the second inverter and a gate terminal of the pull up transistor of the second inverter are coupled together by a first common gate line.

13. The multi-port SRAM cell of claim 12, wherein the first and second common gate lines each include a U-shaped portion overlapping the first and second active regions, respectively.

14. The multi-port SRAM cell of claim 1, wherein the SRAM cell is coupled to a second SRAM cell in a cell array by a twisted bit line conductor coupling.

15. The multi-port SRAM cell of claim 1, wherein the active regions are generally rectangularly shaped.

16. A multi-port static random access memory (SRAM) cell comprising:
first and second cross-coupled inverters having a data storage node and a data bar storage node, each inverter comprising a pull-up transistor and a pull down device, wherein each pull down device comprises at least a pair of pull down transistors having commonly connected source, drain and gate terminals;
first and second access ports coupled to first and second word line conductors, each access port including a first pass gate transistor coupled to the data storage node and a second pass gate transistor coupled to the data bar storage node, each pass gate transistor being coupled to a respective bit line conductor;
a first power supply conductor Vdd and a pair of second power supply conductors Vss;
a first metallization layer including conductors for making local intra-cell connections between the pass gate transistors and the pull down devices;
a second metallization layer formed over the first metallization layer containing the bit line conductors and power supply conductors; and
a third metallization layer formed over the second metallization layer containing the word line conductors.

17. The multi-port SRAM cell of claim 16, wherein the first metallization layer also makes local intra-cell connections between the pull down devices and the pull up transistors.

18. A multi-port static random access memory (SRAM) cell comprising:
first and second cross-coupled inverters having a data storage node and a data bar storage node, each inverter comprising a pull-up transistor and a pull down device;
first and second access ports coupled to first and second word line conductors, each access port including a first pass gate transistor coupled to the data storage node and a second pass gate transistor coupled to the data bar storage node, each pass gate transistor being coupled to a respective bit line conductors; and
a first power supply conductor Vdd and a pair of second power supply conductors Vss,
wherein the bit line conductors and power supply conductors are formed in a common metallization layer, and
wherein the bit line and power supply conductors are disposed in parallel, with the first power supply conductor Vdd centered among the conductors and the pair of second power supply conductors Vss disposed adjacent the first power supply conductor on opposite sides of the first power supply conductor.

19. The multi-port SRAM cell of claim 18, wherein the bit line conductors that are coupled to the data storage node through respective pass gate transistors are disposed on a first side of the power supply conductors, and the bit line conductors that are couple to the data bar storage node through respective pass gate transistors are disposed on a second, opposite side of the conductors.

* * * * *

UNITED STATES PATENT AND TRADEMARK OFFICE
CERTIFICATE OF CORRECTION

| | | |
|---|---|---|
| PATENT NO. | : 8,009,463 B2 | Page 1 of 1 |
| APPLICATION NO. | : 12/533394 | |
| DATED | : August 30, 2011 | |
| INVENTOR(S) | : Jhon Jhy Liaw | |

It is certified that error appears in the above-identified patent and that said Letters Patent is hereby corrected as shown below:

Column 2, Line 27, delete "foamed" and insert -- formed -- therefor.

Signed and Sealed this
Third Day of January, 2012

David J. Kappos
*Director of the United States Patent and Trademark Office*